(12) United States Patent
Alpert et al.

(10) Patent No.: US 8,782,584 B2
(45) Date of Patent: Jul. 15, 2014

(54) POST-PLACEMENT CELL SHIFTING

(71) Applicant: International Business Machines Corporation, Armonk, NY (US)

(72) Inventors: Charles J Alpert, Austin, TX (US); Zhuo D Li, Austin, TX (US); Gi-Joon Nam, Austin, TX (US); Shyam Ramji, Hopewell Junction, NY (US); Lakshmi N Reddy, Yorktown Heights, NY (US); Jarrod A Roy, Austin, TX (US); Taraneh E Taghavi, San Diego, CA (US); Paul G Villarrubia, Austin, TX (US); Natarajan Viswanathan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/902,303

(22) Filed: May 24, 2013

(65) Prior Publication Data

US 2013/0346938 A1    Dec. 26, 2013

Related U.S. Application Data

(63) Continuation of application No. 12/796,550, filed on Jun. 8, 2010, now Pat. No. 8,495,534.

(51) Int. Cl.
*G06F 17/50* (2006.01)
(52) U.S. Cl.
USPC ........... 716/110; 716/111; 716/119; 716/122; 716/135
(58) Field of Classification Search
USPC ......... 716/100–106, 110–112, 118–126, 132, 716/135
See application file for complete search history.

(56) References Cited

U.S. PATENT DOCUMENTS

| | | | |
|---|---|---|---|
| 6,415,426 B1 | 7/2002 | Chang et al. | |
| 6,948,145 B2 | 9/2005 | Brown, III et al. | |
| 7,404,168 B2 | 7/2008 | Miller et al. | |
| 7,669,160 B2 | 2/2010 | Furnish et al. | |
| 2001/0014965 A1* | 8/2001 | Hiraga | 716/13 |
| 2004/0040007 A1* | 2/2004 | Harn | 716/11 |

(Continued)

OTHER PUBLICATIONS

Spindler, Peter; Fast and Accurate Routing Demand Estimation for Efficient Routability-Driven Placement; Date: Apr. 16, 2007; pp. 1-6; EDAA.

(Continued)

*Primary Examiner* — Paul Dinh
(74) *Attorney, Agent, or Firm* — Parashos Kalaitzis; Robert C. Rolnik

(57) ABSTRACT

A computer implemented method for reworking a plurality of cells initially placed in a circuit design. An expander allocates cells to tiles. The expander determines a high detailed routing cost tile class, wherein the high detailed routing cost tile class is a class of tiles that has high detailed routing costs. The expander selects a cell within a tile of the high detailed routing cost tile class to form a selected cell in a selected tile. The expander applies multiple techniques to reposition these cells at new locations to improve the detailed routability. The expander can place an expanded bounding box around the selected cell, wherein the bounding box extends to at least one tile adjacent the selected tile, and repositions the selected cell within the bounding box to form a modified design to improve the detailed routability. The expander may also inflate and legalize those cells.

1 Claim, 8 Drawing Sheets

(56) References Cited

U.S. PATENT DOCUMENTS

| | | |
|---|---|---|
| 2008/0178128 A1 | 7/2008 | de Dood et al. |
| 2008/0250375 A1 | 10/2008 | Miller et al. |
| 2009/0031269 A1 | 1/2009 | Chen et al. |
| 2009/0083689 A1 | 3/2009 | Ringe et al. |
| 2009/0113368 A1* | 4/2009 | Lin et al. .................. 716/10 |
| 2009/0271754 A1 | 10/2009 | Chang et al. |
| 2009/0319977 A1 | 12/2009 | Saxena et al. |
| 2010/0031214 A1 | 2/2010 | Hou et al. |
| 2011/0055784 A1* | 3/2011 | Gao et al. ................. 716/125 |

OTHER PUBLICATIONS

Liu, Shenghua; FREe: A Fast Routability Estimator; International Conference; Date: Jun. 25, 2006; pp. 2454-2458; NSFC.

Kusnadi; Routability Checking for General Area Routing Problems, Twelfth Annual IEEE International; Date: Sep. 15, 1999; pp. 201-205; IEEE.

Jiang, Zhe-Wei; Routability-Driven Analytical Placement by Net Overlapping Removal for Large-Scale Mixed-Size Designs; 45th ACM/IEEE; Date: Jun. 8, 2008; pp. 167-172; IEEE.

* cited by examiner

POST-PLACEMENT CELL SHIFTING

BACKGROUND

The present invention relates generally to a computer implemented method for electronic design automation. More specifically, the present invention relates to selecting cells and/or tiles for congestion reduction after initial placement of the library cells.

Designing integrated circuits is a process that grows in complexity as the feature sizes of circuits shrink from one design generation to the next. As the count of circuits grows on a given die size, the number of pins or conductors that need to be routed between logical elements grows at an inverse square relationship to the size of the smallest circuit feature. Accordingly, routing, and specifically detailed routing, between and among pins has grown complex over the years. Further complexity occurs because the number of design rules that limit the allowable geometries adds to the set of calculations necessary when employing computers to perform detailed routing.

A technology, or technology node, is a design constraint that sets a predetermined minimum width for conductors. A minimum permissible width is a lower threshold of the smallest wire or conductor agreed-on between the circuit designer and the fabricator of integrated circuits using the design of the circuit designer. The technology node is limited by factors such as lithography and vapor deposition accuracy expected in semiconductor manufacturing equipment. Since at nanometer scales, statistical variations may cause feature edges to alternatively be within or outside of tolerances, the technology node is a goal of the manufacturing process that may be determined to be met with near certainty. At a technology node, the fabricator makes assurances that a very low yield of defects will occur due to reasons of fabrication unintentionally making features larger or smaller than the minimum permissible width, despite a circuit design occasionally requiring minimum permissible widths. Similar to minimum permissible width for conductors, minimum permissible pin width can be defined for each technology as the minimum width of pins in a library cell.

A path or route is a geometric description of the interconnect between a set of pins or endpoints of one or more nets. A net is a subset of components in an integrated circuit design as well as the interconnection of the pins of the subset of components. Each path is associated with a path delay or timing delay. The path may pass through a net associated with a first component, and a net of a second component. The path can be a 2-pin net. Thus, the path may link two or more components together by including at least one endpoint or pin of each component. A pin is an input or an output wire to a component. A netlist describes all the components in a design, and describes how these components or pins on the components are interconnected. The netlist may be described in a text file that corresponds to the component. The netlist may be a derivative, through additional processing, of a file format that may be as described by Verilog®, VHSIC Hardware Design Language (VHDL), among other high-level design languages. Verilog is a trademark of Cadence Design Systems.

Detailed routing of paths or routes is computationally complex. Accordingly, this step of the design process may take days and does not assure that all nets in a design will be routable. When intractable, non-routable nets are discovered, many hours or days of delay may be incurred due to a partially-performed detailed routing, and potentially requiring the circuit designer to set up a detailed routing again with additional incremental changes.

BRIEF SUMMARY

The present invention provides a computer implemented method for reworking a plurality of cells initially placed in a circuit design. A data processing system allocates cells to tiles, wherein some tiles have single or multiple cells. The data processing system executes an expander application (or expander) to determine a high detailed routing cost tile class, wherein the high detailed routing cost tile class is a class of tiles that are expected to be difficult to complete detailed routing optimization. The expander selects a cell within a tile of the high detailed routing cost tile class to form a selected cell in a selected tile. On these cells, the expander applies multiple techniques to reposition these cells at new locations to improve the detailed routability. The expander finds a bounding box of the selected cell so that the wire length of the selected cell can be minimized. The bounding box is then expanded at four sides (north/south/east/west) to expand the placement solution space to a certain degree. Then the expander relocates the selected cell within the expanded bounding box to form a modified design with a better detailed routing cost distribution among the tiles. The expander expands the selected cell within the bounding box to form a modified design. After these transformations, the expander determines an aggregate routing cost among other steps, and affirms the modified design for further processing.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1:
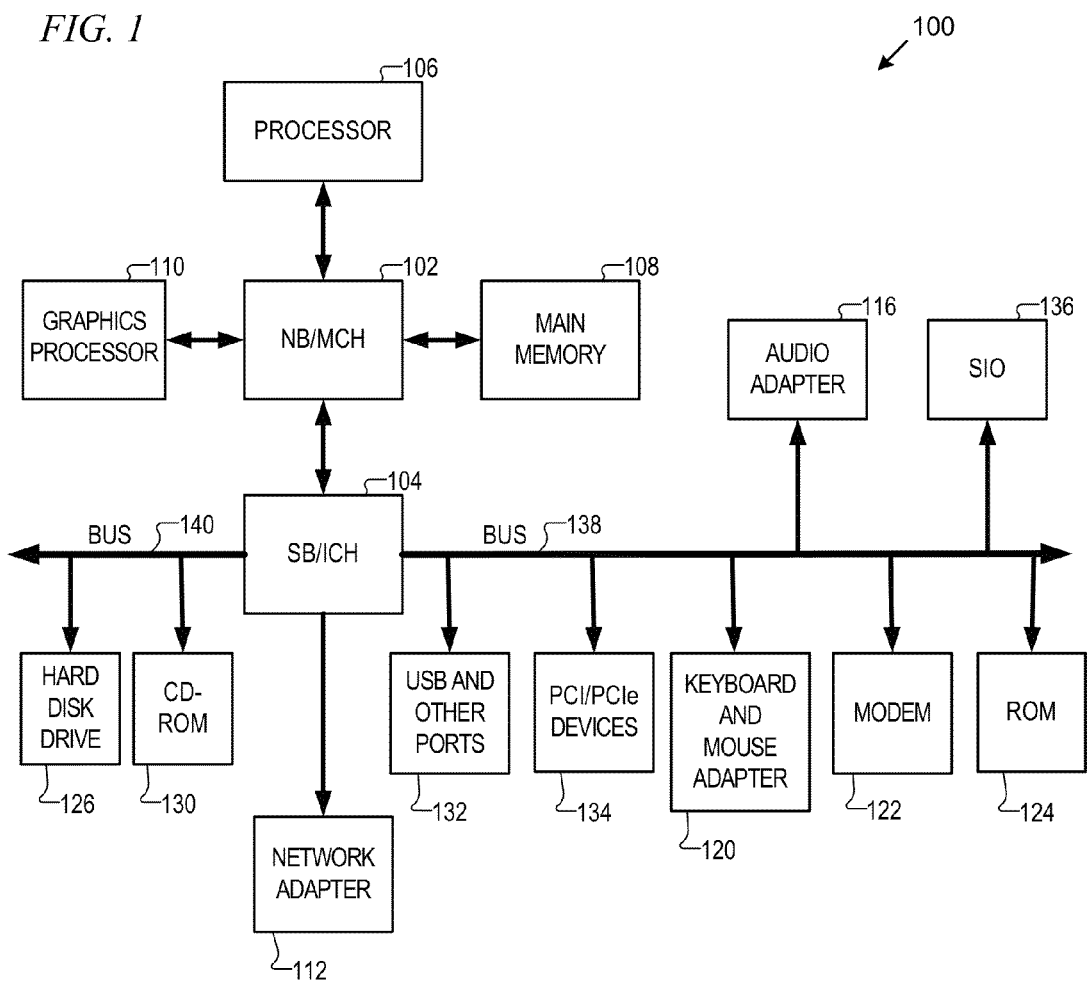
FIG. 1 is a block diagram of a data processing system in accordance with an illustrative embodiment of the invention.

With reference now to the figures and in particular with reference to FIG. 1, a block diagram of a data processing system is shown in which aspects of an illustrative embodiment may be implemented. Data processing system 100 is an example of a computer, in which code or instructions implementing the processes of the present invention may be located. In the depicted example, data processing system 100 employs a hub architecture including a north bridge and memory controller hub (NB/MCH) 102 and a south bridge and input/output (I/O) controller hub (SB/ICH) 104. Processor 106, main memory 108, and graphics processor 110 connect to north bridge and memory controller hub 102. Graphics processor 110 may connect to the NB/MCH through an accelerated graphics port (AGP), for example.

In the depicted example, local area network (LAN) adapter 112 connects to south bridge and I/O controller hub 104 and audio adapter 116, keyboard and mouse adapter 120, modem 122, read only memory (ROM) 124, hard disk drive (HDD) 126, CD-ROM drive 130, universal serial bus (USB) ports and other communications ports 132, and PCI/PCIe devices 134 connect to south bridge and I/O controller hub 104 through bus 138 and bus 140. PCI/PCIe devices may include, for example, Ethernet adapters, add-in cards, and PC cards for notebook computers. PCI uses a card bus controller, while PCIe does not. ROM 124 may be, for example, a flash binary input/output system (BIOS). Hard disk drive 126 and CD-ROM drive 130 may use, for example, an integrated drive electronics (IDE) or serial advanced technology attachment (SATA) interface. A super I/O (SIO) device 136 may be connected to south bridge and I/O controller hub 104.

An operating system runs on processor 106, and coordinates and provides control of various components within data processing system 100 in FIG. 1. The operating system may be a commercially available operating system such as Microsoft® Windows® XP. Microsoft and Windows are trademarks of Microsoft Corporation in the United States, other countries, or both. An object oriented programming system, such as the Java™ programming system, may run in conjunction with the operating system and provides calls to the operating system from Java™ programs or applications executing on data processing system 100. Java™ is a trademark of Sun Microsystems, Inc. in the United States, other countries, or both.

Instructions for the operating system, the object-oriented programming system, and applications or programs are located on storage devices, such as hard disk drive 126, and may be loaded into main memory 108 for execution by processor 106. The processes of the present invention can be performed by processor 106 using computer implemented instructions, which may be located in a memory such as, for example, main memory 108, read only memory 124, or in one or more peripheral devices.

Those of ordinary skill in the art will appreciate that the hardware in FIG. 1 may vary depending on the implementation. Other internal hardware or peripheral devices, such as flash memory, equivalent non-volatile memory, and the like, may be used in addition to or in place of the hardware depicted in FIG. 1. In addition, the processes of the illustrative embodiments may be applied to a multiprocessor data processing system.

In some illustrative examples, data processing system 100 may be a personal digital assistant (PDA), which is configured with flash memory to provide non-volatile memory for storing operating system files and/or user-generated data. A bus system may be comprised of one or more buses, such as a system bus, an I/O bus, and a PCI bus. Of course, the bus system may be implemented using any type of communications fabric or architecture that provides for a transfer of data between different components or devices attached to the fabric or architecture. A communication unit may include one or more devices used to transmit and receive data, such as a modem or a network adapter. A memory may be, for example, main memory 108 or a cache such as found in north bridge and memory controller hub 102. A processing unit may include one or more processors or CPUs. The depicted example in FIG. 1 is not meant to imply architectural limitations. For example, data processing system 100 also may be a tablet computer, laptop computer, or telephone device in addition to taking the form of a PDA.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, data processing systems, and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The illustrative embodiments permit an assessment of each tile within a circuit design such that each tile is given a value that indicates a likely difficulty in routing interconnecting paths or routes to the pins present in the tile. Such an assessment, which may be a detailed routing cost, can be used to select a set of tiles for techniques designed to reduce pin counts and/or increase routability of pins within the tile. In addition, the use of a detailed routing cost associated with each tile, using illustrative embodiments, may be used to identify unroutable tiles before performing detailed routing.

Figure 2A:
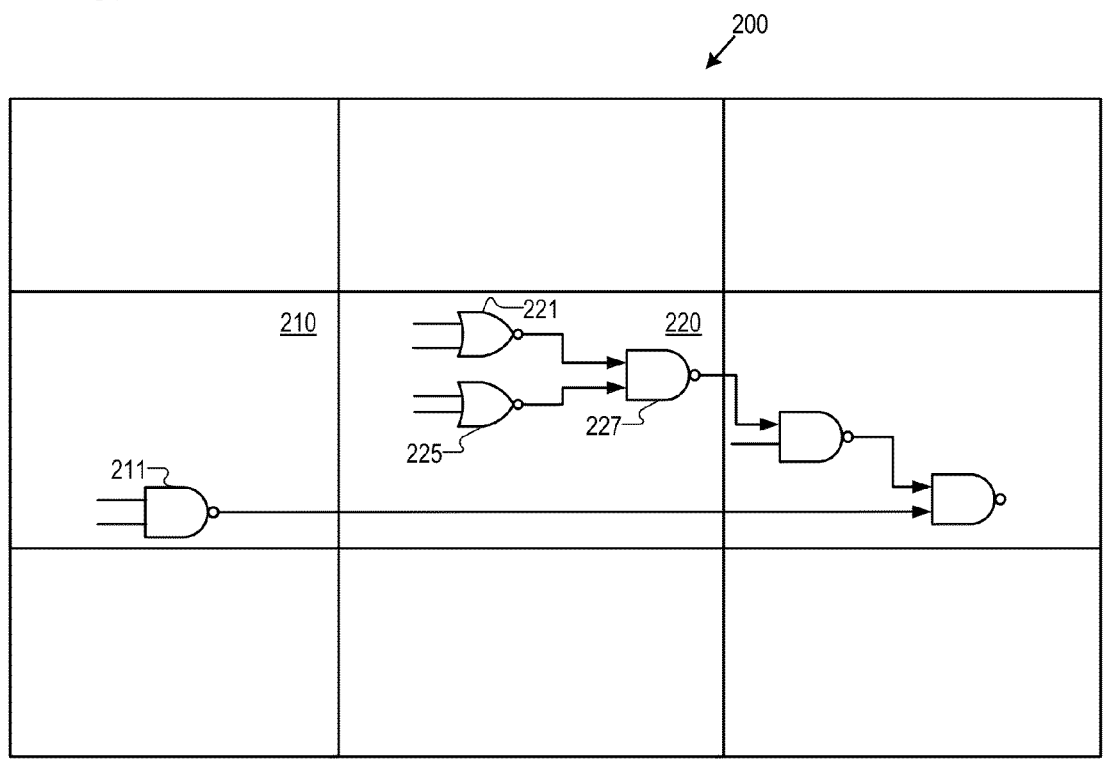
FIG. 2A is a block diagram of an logical symbols within a tile structure in accordance with an illustrative embodiment of the invention.

FIG. 2A is a block diagram of logical symbols within a tile structure in accordance with an illustrative embodiment of the invention. A cell is a design for a circuit for implementation in a semiconductor die. A library cell is a specification of a logic gate or other circuit used to process digital signals by defining, for example, pins, and transistor couplings between pins. The library cell may specify parameters, including, for example, a number of input pins, a number of output pins, a minimum allowable distance between pins, and the like. A parameter may include the relative Cartesian coordinates between pins, as well as the contours of each pin. From the parameters, further information concerning the pins can be derived, including the area of each pin.

Accordingly, FIG. 2A is a logical arrangement of circuits on substrate 200. A substrate may be any suitable substrate used to construct integrated circuits, such as, for example, crystalline silicon. Substrate 200 is divided, for example, into nine tiles. A tile is an area allocated to one or more library cells in a manner that provides for many tiles to be placed in a grid pattern across a substrate. FIG. 2A depicts nine tiles in a circuit design for a substrate. However, it is appreciated that many hundreds of tiles can be arranged for circuit designs. For example, tile 210 is allocated to library cell 211, which is a NAND gate. Tile 220 is allocated to three library cells, namely NOR gate 221, NOR gate 225 and NAND gate 227. Routing goals are established in FIG. 2A based on the connectivity between library cells. The job of detailed routing or a data processing system that performs detailed routing, is to create a topology that meets design constrains used to assure goals for timing, avoiding capacitive coupling, and power consumption, among others, are met. An output of detailed routing is establishing the geometry for signals to follow in a metal layer of an integrated circuit to be built in accordance with fabrication processes that meet the design constraints of a technology node.

A pin is a conductor used to carry a signal into or out of a library cell. Each library cell in substrate 200 has two inputs and a single output. Accordingly, each library cell of FIG. 2A has three pins.

Figure 2B:
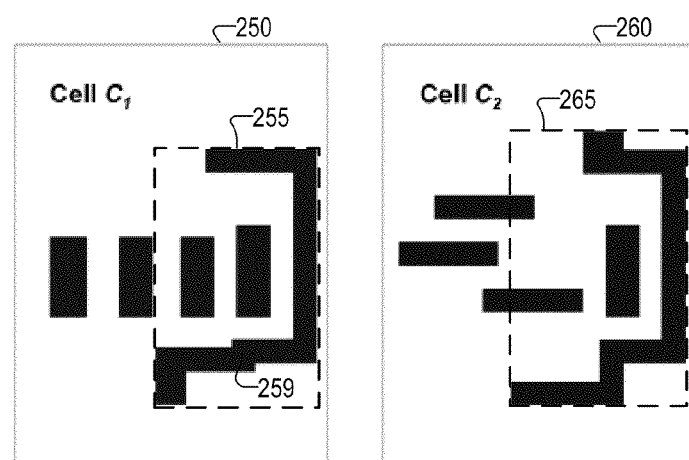
FIG. 2B is an example of two arrangements of pins of a library cell in accordance with an illustrative embodiment of the invention.

FIG. 2B is an example of two arrangements of pins of a library cell in accordance with an illustrative embodiment of the invention. Each library cell may perform an identical logic function. However, library cell 250 may have pins arranged in a different geometry as compared to library cell 260. Each library cell, accordingly, has different parameters used to describe it. For example, although each corresponding pin of library cell 250 and library cell 260 may have the same area, each pin is oriented differently, and may have different shapes. Each library cell may be assigned a different library cell detailed routing cost, depending on the parameters. A detailed routing cost is an estimate of the difficulty to route a connecting conductor to all the pins of a one or more cells or library cells that a circuit design requires to be connected. Accordingly, a high library cell detailed routing cost may indicate that the pin is more difficult to be routed, or face a higher risk of being unroutable in its current geometry as compared to a low library cell detailed routing cost. The library cell detailed routing cost may be an estimate. Thus, the value of the detailed routing cost may lie in its ability to predict portions of a design that either create unwanted levels of risk, or that may be intractable to resolve with available computing resources. Area 255 and area 265 are examples of bounding boxes, explained further below.

Figure 3A:
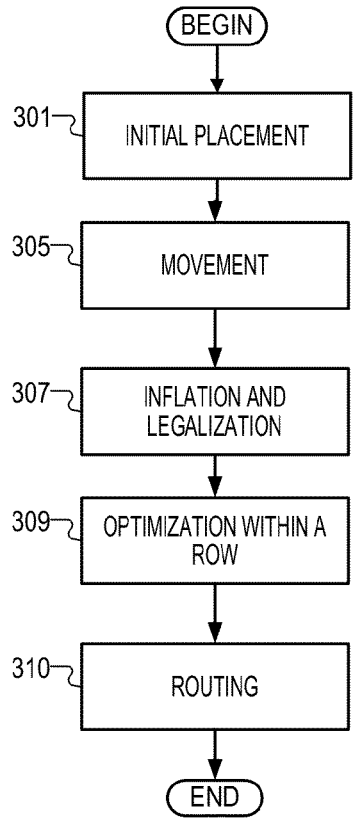
FIG. 3A is an overview of steps used to place and route circuits in a semiconductor substrate in accordance with an illustrative embodiment of the invention.

FIG. 3A is an overview of steps used to place and route circuits in a semiconductor substrate in accordance with an illustrative embodiment of the invention. Although the following description refers to cells as being inflated, moved, and otherwise changed, it is recognized that all such transformations are to the data, that symbolically stores the properties and parameters of each cell, as related to the frame of reference of a semiconductor die. Accordingly, the design can receive incremental improvements through one or more automated design steps. Once a logical design is available, a data processing system performs initial placement (step 301). Initial placement can allocate library cells to tiles observing a minimal set of rules, for example, assuring that wirelengths by Cartesian distances are below a threshold between pins that are to be routed. Another rule can be that the initial placement must not generate overlapping cells. The data processing system may also perform physical optimization synthesis at this time. Next, a data processing system may perform a movement phase (step 305). Movement can include moving one or more library cells to counteract any adverse effects that can be present in the initial placement.

Next, a data processing system may perform inflation and legalization (step 307). During the inflation and legalization phase, the physical size of cells in congested tiles is intentionally increased. This size increase can lead to overlapping cells. Consequently, the data processing system detects such overlapping of cells and responsively legalizes components to the cell to create a non-overlapping placement solution. As a concluding step to this phase, the legalized cell is contracted in a reciprocal relationship as when it was earlier expanded. Such steps may provide gaps of unused semiconductor space between the cells subjected to this phase and nearby cells. Next, the data processing system may perform optimization within a row (step 309). Finally, the data processing system performs detailed routing (step 310). Processing may terminate thereafter. Steps 307, 309, and/or 310 provide a modified circuit design. A modified circuit design is a design that, although not fully complete, is incrementally advanced from mere placement of logic in a manner that is expected to produce a routable design.

Figure 3B:
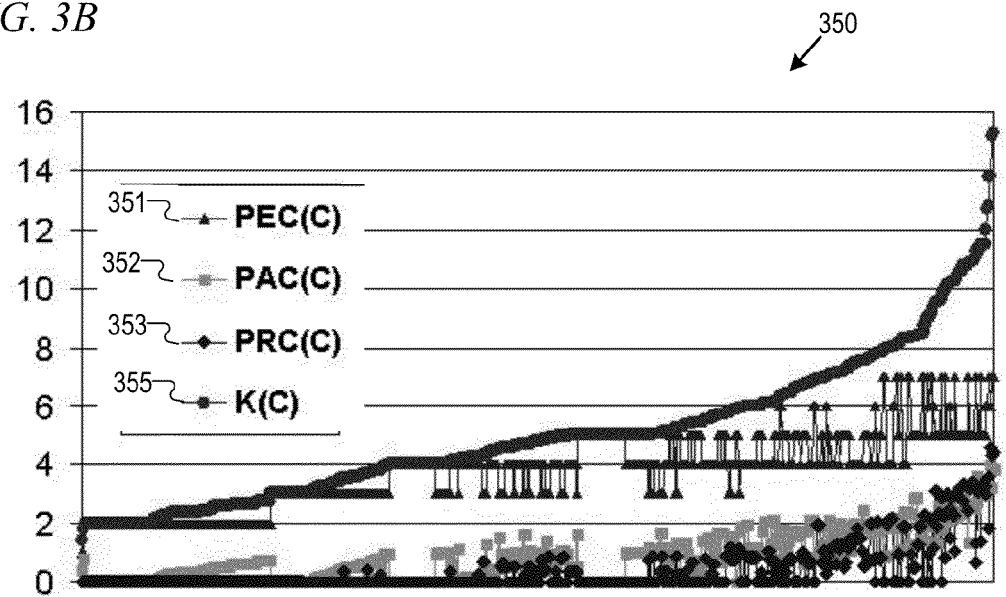
FIG. 3B is a depiction of an aggregate routing cost with component routing costs in accordance with an illustrative embodiment of the invention.

FIG. 3B is a depiction of an aggregate routing cost with component routing costs in accordance with an illustrative embodiment of the invention. Chart 350 shows a distribution of 700 or more cells for which routing costs are determined. Routing costs for each cell are arranged uniformly across the X-axis such that for each cell, the aggregate routing cost 355 ascends from left to right in a fine-grained manner. The Y-axis is the value obtained for each cell of estimated detailed routing cost, where a higher value indicates an estimated degree of the difficulty of detailed routing as compared to lower values on the Y-axis. As can be seen, the routing costs 351, 352, and 353 that form three addends of a sum of each aggregate routing cost, or K(C), are more granular and take larger quantum leaps between levels for each sub-component. Accordingly, use of such an aggregate routing cost as a metric for determining congestion of either a cell or a tile can permit consideration of each of three contributors to the aggregate routing cost. The calculation of each component, as well as the aggregate routing cost are explained further with reference to FIG. 4, below.

Figure 4:
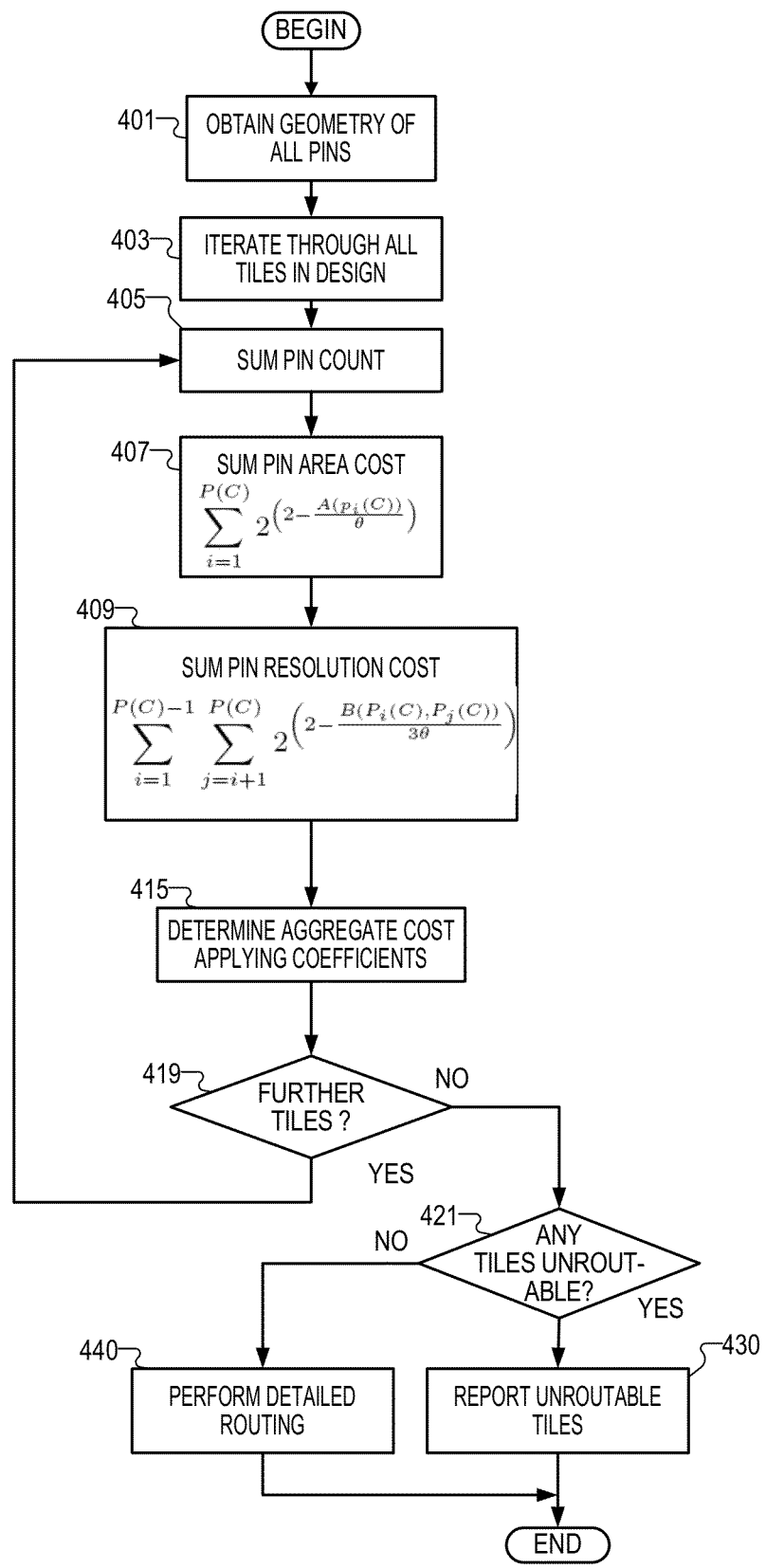
FIG. 4 is a flowchart of steps to determine one or more detailed routing costs in accordance with an illustrative embodiment of the invention.

FIG. 4 is a flowchart of steps to determine one or more detailed routing costs in accordance with an illustrative embodiment of the invention. FIG. 4 may take as input, the set of library cells allocated to a design, and their initial placement within a substrate or die, as for example, determined by initial placement (step 301) of FIG. 3A. FIG. 4 describes three individual subcomponents to a library cell detailed routing cost. However, each subcomponent may itself be a cell detailed routing cost. Nevertheless, since each subcomponent accounts for one or few factors among many known to affect routability, the aggregate of all subcomponents may form a more accurate predictor of costs to routing all pins in a library cell or a tile. The steps of FIG. 4 may be performed by a data processing system executing an application called a congestion detector. The data processing system may be, e.g., the data processing system 100 of FIG. 1.

Initially, the congestion detector obtains all geometry of all pins in a circuit design (step 401). The geometry of the pins may be as arranged before or during steps 305-309 of FIG. 3A. A circuit design is a design for which logical circuits are selected, and in particular where each logical circuit is assigned to be implemented by a cell, for example, a library cell. In addition, the circuit design describes a topology where each pin in a library cell is to be routed to another pin or pins of the library cell or other library cells. Accordingly, as part of obtaining the geometry of all pins, the congestion detector obtains the parameters of the design. The parameters include the geometry of each library cell, as well as the tile to which it is assigned.

Next, the congestion detector iterates through all tiles in the design (step 403). For example, the library cells may be assigned to tiles, which may be numbered 1 through 100. Step 403 may propagate through the tiles by initializing processing through a data structure that contains or otherwise references the library cells on a per tile basis.

Next, the congestion detector may establish a first subcomponent to a detailed routing cost. Accordingly, the congestion detector gives a count of the sums of pins in the current tile (step 405). Thus, a data structure associated with a tile may be a list of one or more library cells that are allocated to the tile. Accordingly, a lookup of each library cell's associated pin count may be performed for each library cell present in the tile, and the count added to a total for the tile until the list is exhausted. At its simplest level, this step simply counts the number of pins to a single library cell.

The congestion detector may establish a second subcomponent to the detailed routing cost. In this step, the congestion detector may form a sum based on the areas of each pin (step 407). The pins that are used in the sum are those of a cell or a collection of cells assigned to a tile. The pin area cost is calculated as follows:

$$PAC(C) = \sum_{i=1}^{P(C)} 2^{\left(2 - \frac{A(p_i(C))}{\theta}\right)} \qquad \text{Equation (1)}$$

where P(C) is a number of pins in the library cell; $A(p_i(C))$ is an area of a pin i among pins of the cell or the library cell, with $0 < i \leq P(C)$; and theta is a minimum permissible pin width. In the case where multiple library cells are being considered together within a tile, the above Equation (1) becomes $$PAC(C) = \sum_{j=1}^{T} \sum_{i=1}^{P(C_j)} 2^{\left(2 - \frac{A(p_i(C_j))}{\theta}\right)}$$ Equation (2)

where T is the total number of cells present in the tile, and pi(Cj) is the ith pin of the jth cell in the tile. Accordingly, the pin area cost can be a sum among all pin area costs of the library cells in the tile. Thus, a pin area cost is the sum determined by either Equation (1) or (2) above.

Next the congestion detector may determine a third subcomponent. The congestion detector may determine a pin resolution cost (step 409). The pin resolution cost may be a measure of openness of the library cell to permit passage of a trace or route between and among the pins of the library cell. Accordingly, the pin resolution cost may be calculated by adding an exponent-based values, where each is determined by a unique combinations of pins within a library cell.

By exhausting all unique combinations of pin combinations, the congestion detector may calculate each addend of the sum. The equation for determining the pin resolution cost is:

$$PRC(C) = \sum_{i=1}^{P(C)-1} \sum_{j=i+1}^{P(C)} 2^{\left(2 - \frac{B(P_i(C), P_j(C))}{3\theta}\right)}$$ Equation (3)

where $B(P_i(C), P_j(C))$ is the area of a bounding box that covers $pin_i$ and $pin_j$. A bounding box is a rectangle that is aligned to the Cartesian coordinate frame of the tiles and encloses all parts of at least one pin. For example, bounding box 255 encloses pin 259 in FIG. 2B. In other words, the bounding box is the product of the span of at least one pin across a dimension and the span of the at least one pin across an orthogonal dimension. A bounding box can be applied to a set of pins, where a difference between leftmost and rightmost parts of the set of pins is multiplied by the topmost and bottommost parts of the set of pins. However, for purposes of Equation (3), the bounding box encloses a pair of pins indexed by the variables i and j. Accordingly, the congestion detector may determine the third component of detailed routing cost. Like the pin area cost determination, the congestion detector may execute Equation (3) for each library cell, and sum the results to obtain the pin resolution cost for the tile which each library cell occupies Next, the congestion detector may determine an aggregate detailed routing cost by applying coefficients to the subcomponents (step 415). Accordingly, each of 1) the sum of pin counts; 2) result of Equation (1); and 3) result of Equation (3) may be multiplied by pin existence cost weight (α), pin area cost weight (β), and pin resolution cost weight (γ), respectively. A further formulation of the aggregate detailed routing cost may be:

$$K(C) = \alpha * PEC(C) + \beta * PAC(C) + \gamma * PRC(C).$$ Equation (4)

Next, the congestion detector may determine whether further tiles are present (step 419). If further tiles are present, the congestion detector repeats step 405-419. Otherwise, the congestion detector may determine if any tiles are unroutable (step 421). The congestion detector achieves step 421 by determining whether K(C) is above a threshold congestion value (implying the tile is unroutable). A negative determination at step 421 may result in the congestion detector performing detailed routing (step 440). Detailed routing may be interleaved with steps 305-309 as well as 310 of FIG. 3A.

On the other hand, the congestion detector may determine that some tiles exceed the threshold congestion value. Accordingly, the congestion detector may report each tile that exceeds the threshold congestion value as unroutable (step 430). Processing may terminate thereafter.

Accordingly, illustrative embodiments may use the outcomes of routable or unroutable tiles from FIG. 4 to either immediately perform detailed routing, or submit a design to other processes or designers for rework of the initial placement of the circuit, redesign of the logic in the circuit design or both. Further use of the aggregate detailed routing cost may be used in altered arrangements of tiles that can occur with incremental design changes intended to reduced congestion in the worst congested cells, as, for example, may be determined using the subcomponents determined at least at steps 405-409, and optionally 401 and 415, above.

Additional steps that can reduce congestion within a tile are as follows. A data processing system may arrange library cells within tiles in a circuit design allocated to a substrate wherein each tile contains at least two cells. The data processing system may move at least one cell library from a high aggregate routing cost tile to a low aggregate detailed routing cost tile, wherein the low aggregate routing cost tile is low relative to the high aggregate detailed routing cost tile. In other words, the data processing system may select the one or more tiles that have the highest aggregate detailed routing cost, and target those tiles for congestion reduction. Accordingly, with each movement of cells from one tile to the other tile, the pin count diminishes in the first tile. Consequently, at least that component of an aggregate detailed routing cost will be reduced with respect to that tile. If the aggregate detailed routing cost of the second tile does not become higher than the previous aggregate detailed routing cost for the first tile, then the move may be considered to be good, and therefore maintained.

In other words, the data processing system may use a software component called a design movement application to iteratively move cells within a set of source cells known to be within high aggregate detailed routing cost tiles. The design movement application may be machine instructions implemented on a data processing system, for example, data processing system 100 of FIG. 1. The design movement application can move or shift cells in a manner to diminish exaggerated differences in routing cost metrics (such as aggregate detailed routing costs) between tiles of a design. Accordingly, the design movement application can distribute cells from one tile to another so as to smooth out congestion, measured as described above, in order to ease the operation of the routing phase.

Figure 5:
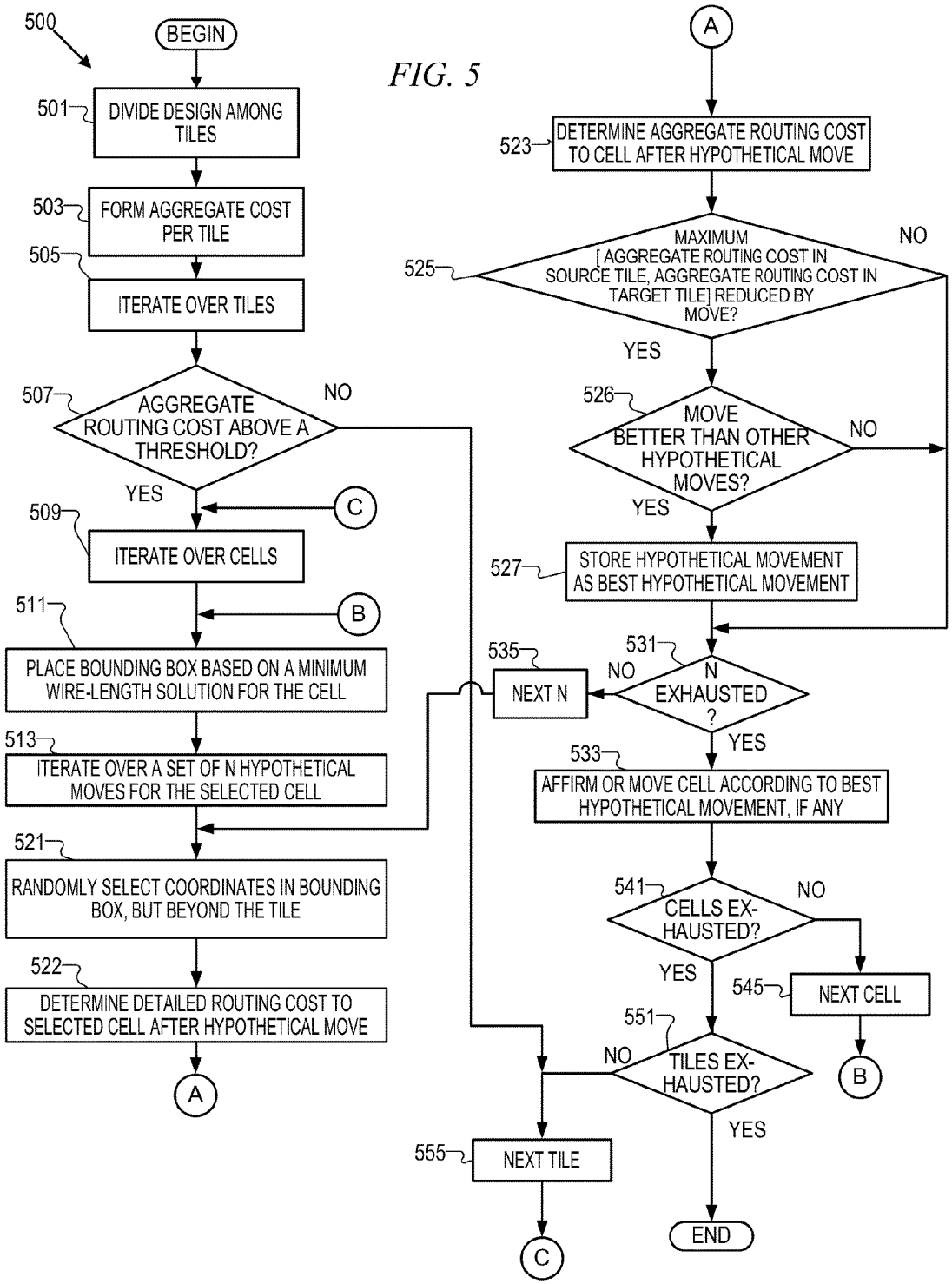
FIG. 5 is a flowchart of movement of cells in accordance with an illustrative embodiment of the invention.

FIG. 5 is a flowchart of movement of cells in accordance with an illustrative embodiment of the invention. Flowchart 500 may be an implementation of movement phase 305 of FIG. 3A. An input to the process of FIG. 5 can be a die specification that allocates or forms tiles for the usable area of the die. Initially, the design movement application may divide a design among tiles (step 501). Next, the design movement application may form aggregate routing costs for each tile (step 503).

Next, the design movement application may iterate steps over the tiles (step 505). Iterating involves initializing an index or counter to traverse the set of tiles testing for exhaustion of set of tiles in a loop of repeating steps. In this case, the loop can include steps 507 through 555, described further below, and including an incrementing, advancing or traversing step that makes a new tile current for further processing in the loop controlled by the design movement application.

Next, the design movement application may form an aggregate routing cost among all tiles in a manner to determine whether a tile has an aggregate routing cost above a threshold (step 507). Consequently, the design movement application can determine which among the tiles fall into a high aggregate routing cost tile class. Step 507 may rely on most or all of the steps described above in relation to FIG. 4 in order to assign detailed routing costs to each tile, and thereby, determine a high detailed routing cost tile class. A high detailed routing cost tile class is the class or set of tiles that are among a given highest percent, among all tiles of a design, with respect to routing cost. The determination of high detailed routing cost may alternatively be a measure collection of tiles that exceed a threshold value for routing cost. Accordingly, a high detailed routing cost tile is a tile that has an aggregate routing cost that exceeds a threshold or otherwise is expected to be difficult to complete detailed routing optimization. FIG. 4 steps may be performed at step 503, and elsewhere among FIG. 5 steps, where needed to obtain a routing cost. Accordingly, a positive result causes the design movement application to proceed to step 509, or, alternatively, a negative result at step 507 causes a next tile, if any, to be selected at step 555.

Next, provided a positive result occurs at step 507, the design movement application may iterate over cells for each tile where plural cells are assigned (step 509). Accordingly, the design movement application may initialize a counter to loop over all cells in a manner that permits steps 511 through 545 to work in a manner to select a cell from within a selected tile for further processing. Next, the design movement application may place a bounding box around the cell based on the minimum wire-length solution for the cell (step 511). For each cell, assuming all other connected cells are fixed, the minimum wire-length bounding box can be calculated in linear time. If the cell being considered is placed at any arbitrary location within the minimum wire-length bounding box, the wire length of nets connected to the cell can be minimized. Step 511 may include initially making the bounding box the minimum wire-length solution for the cell, including a step that proportionally expands the four sides of the bounding box an equal distance from the minimum wire-length bounding box of the cell. As a result, the design movement application may form an expanded bounding box. An expanded bounding box is a bounding box for a cell that is proportionally larger than the minimum wire-length solution for the cell. The proportion may be previously selected by a designer or operator of the design movement application, wherein the proportion is the amount the bounding box is expanded each time step 511 is executed. The expanded bounding box may extend to at least one tile adjacent the selected tile.

Next, the design movement application may iterate over a set of N hypothetical moves of the selected cell (step 513). N is a number that is preset by an operator to the design movement application. N may be selected in a manner that balances the selection of options for moving cells against the available time or computing resources that are available to test each hypothetical move. Accordingly, step 513 may initialize a counter and coordinate tests and re-iterations performed at steps 531 and 535, respectively.

Steps 521-527 are at the core of three iterating loops that may be performed by the design movement application. These steps trial various hypothetical movements of the selected cells. One is selected, if any, that improves the routing cost of the design so that the highest routing cost, among the tiles tested for routing costs, is either left the same, or is reduced following iterative hypothetical moves of each selected cell of a tile. Each hypothetical movement yields a new modified design. A modified design is a design that varies from the design provided as input to the design movement application. Modified designs include designs that tentatively move a cell, as well as those designs that affirm or commit a tentative cell movement for use in still further modified designs. Accordingly, the design movement application may randomly select coordinates in the bounding box, but beyond the tile in which the selected tile is located (step 521). Thus, each random movement is to a random location, where the random location is selected to be within the bounding box and in a nearby tile. A random location is determined applying pseudorandom generation of numbers to a formula executed by the design movement application. As such, the random location is random with respect to the constraints concerning the requirement that the cell be moved to a nearby tile.

Next, the design movement application determines the aggregate routing cost for the selected tile following the hypothetical move (step 522). Step 522 forms a revised detailed routing cost for the selected tile, which is the detailed routing cost of the selected tile after a hypothetical movement of a cell from the tile. In addition, the design movement application determines the aggregate routing cost for the tile that receives the cell (step 523). Step 523 forms a revised routing cost for the tile adjacent the selected tile, or target tile, responsive to receiving a cell moved by a hypothetical move. Consequently, the design movement application has routing costs that show what the selected tile and the target tile can be revised to, in response to the hypothetical movement. These routing costs can be used to determine first, whether the hypothetical move even improves the routability among the selected tile and the target tile in a manner that at least reduces the maximum routability costs among the tiles. Second, these routing costs can be used to compare the hypothetical movement outcomes for a given cell/tile combination so that the hypothetical movement that is best among the hypothetical movements is selected for affirming or committing to the design as an optimization to a design lacking the affirmed hypothetical movement of the cell.

Thus, the design movement application may determine a maximum among the selected tile and the target tile with respect to aggregate routing costs, and in particular, whether the maximum reduces the aggregate routing costs among the selected tile and the target tile (step 525). A positive result to step 525 may cause the design movement application to determine whether the current hypothetical move is better than other hypothetical moves attempted for the particular cell and tile combination (step 526). A best random location to move a selected cell is one where the maximum routability costs post-move are as good or better than all other hypothetical moves for the selected cell, for example, among the N hypothetical moves. A positive result to step 526 may cause the design movement application to store the hypothetical movement as the best hypothetical movement with respect to the cell/tile combination (step 527) (selected at steps 505, 555, 509, and 545). Negative results to steps 525 and 526 skip step 527. Accordingly, such negative results, and the completion of step 527 can result in the design movement application determining whether sufficient hypothetical movements have been tried, in other words, whether N is exhausted (step 531). If N is not exhausted (step 531), processing repeats at step 521.

However, if N is exhausted, the design movement application may affirm or move the selected cell according to the best hypothetical movement, if any (step 533). Affirming a hypothetical movement means that the design movement application's assignment of the cell to the target tile is to be used as a basis for further design modifications, as well as completion of the design, through, for example, detailed routing. The full process can further include fabrication and implementation of the design in a semiconductor die where the cell occupies the tile selected with at least step 533. Next, the design movement application may determine whether all cells are exhausted (step 541). If all cells are not exhausted, the next cell is selected (step 545). Furthermore, processing repeats at step 511.

However, if the cells within the selected tile are exhausted (positive outcome to step 541), the design movement application may determine if the tiles are exhausted (step 551). If the tiles are not exhausted, the design movement application may select the next tile (step 555). Further processing may repeat at step 509. Accordingly, the design movement application may further iterate over cells assigned to the next tile.

Processing may terminate after a final tile is exhausted at step 551. Accordingly, an incremental improvement may result from the design movement application whereby some of the highest congested tiles, as measured by one or more routing costs, are reduced to a more manageable level of congestion.

Figure 6:
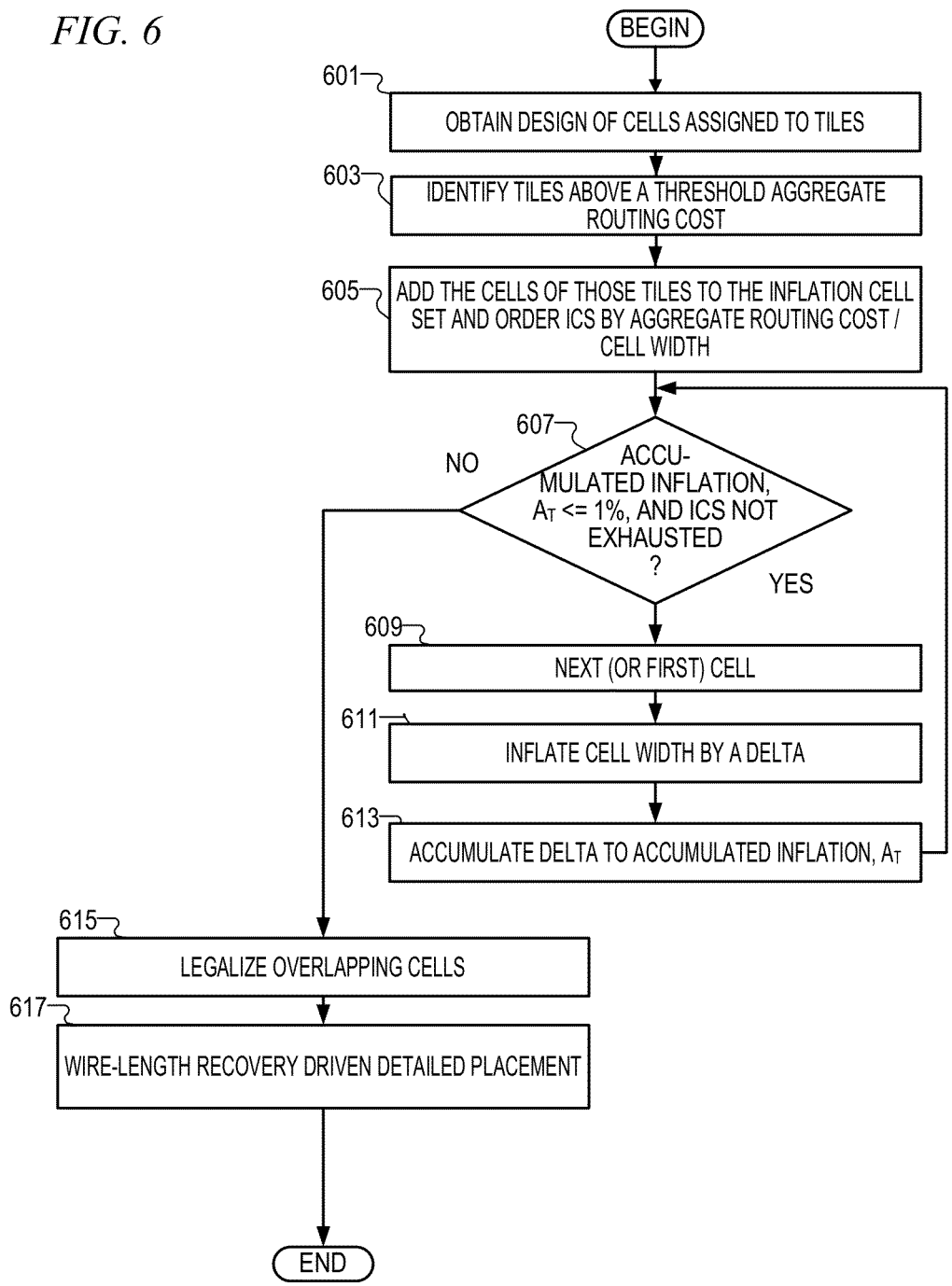
FIG. 6 is a flowchart of an inflation and legalization phase of resolving routing congestion in accordance with an illustrative embodiment of the invention.

FIG. 6 is a flowchart of an inflation and legalization phase of resolving routing congestion in accordance with an illustrative embodiment of the invention. As input to the processing of FIG. 6, the modified design generated by FIG. 5 may be provided. Initially, a design that includes an assignment of cells to tiles is obtained (step 601). Next, the expander application, or expander, may identify tiles having aggregate routing costs above a threshold (step 603). The expander may be a software component executing on a data processing system, such as data processing system 100 of FIG. 1. The threshold may be a highest percentage among all tiles. The threshold may be a predetermined routing cost value.

Next, the expander may add cells of the tiles identified at step 603 to tiles in an inflation cell set (ICS) and order those tiles according to an formula K(C)/W(C) (step 605). In the formula, K(C) is the cell aggregate routing cost, and W(C) is the width of semiconductor assigned to the cell. The inflation cell set is an ordered set of cells that are used to inflate each cell in the set until an accumulated inflation budget is used up. An accumulated inflation budget is an area of the die that may be covered by the combined inflations of all cells. The accumulated inflation budget may be preset by the designer operating the expander, and may be expressed as a percentage of the die surface.

Next, the expander may determine, in an iterative fashion, whether the accumulated inflation budget has been met and whether the inflation cell set is not yet exhausted (step 607). The accumulated inflation budget test can be determined by accumulating inflation of all cells to an accumulated inflation, $A_T$. Accumulated inflation is a variable, register, or other data stored to a data processing system that is initialized to zero and increased responsive to each inflated cell. A subset of cells are those cells that can satisfy the test of step 607 before the inflation cell set is exhausted or before the accumulated inflation exceeds the accumulated inflation budget.

A positive determination to step 607 may result in the expander selecting a next or first cell (step 609). The next or first cell selected is performed in the order of cells that remain in the inflation cell set. Next, the expander inflates the cell by a delta (step 611). A delta is an increase in cell size preset by the operator of the expander. The cell increase can be in proportion to an existing cell width. A cell width is the size of the cell according to a standard library cell. A library cell is 'standard' when the library cell is at the size specified by the library for the particular technology node. Modifications to the cell along any dimension may make the cell into a non-standard library cell, or a cell modified from the standard proportions specified in the library. Next, the expander may accumulate the delta to the accumulated inflation, $A_T$ (step 613). Next, the expander may repeat step 607, thereby determining whether the accumulated inflation is below the threshold and whether the inflation cell set is exhausted. The threshold can be, for example, a proportion of the total cell area, such as, 1% of a total cell area. A total cell area is the area occupied by cells within the semiconductor die or within the circuit design, either in original form, or as modified by iterative improvements to the original circuit design. Continued positive determinations at step 607 permit the expander to traverse the ICS in order.

At some point, the accumulated inflation exceeds the threshold, the ICS is exhausted, or both. Accordingly, a negative outcome at step 607 may cause processing to continue at step 615. Thus, the expander may legalize overlapping cells (step 615). Next, the expander may perform wire-length recovery driven detailed placement (step 617). Processing may terminate thereafter.

Figure 7:
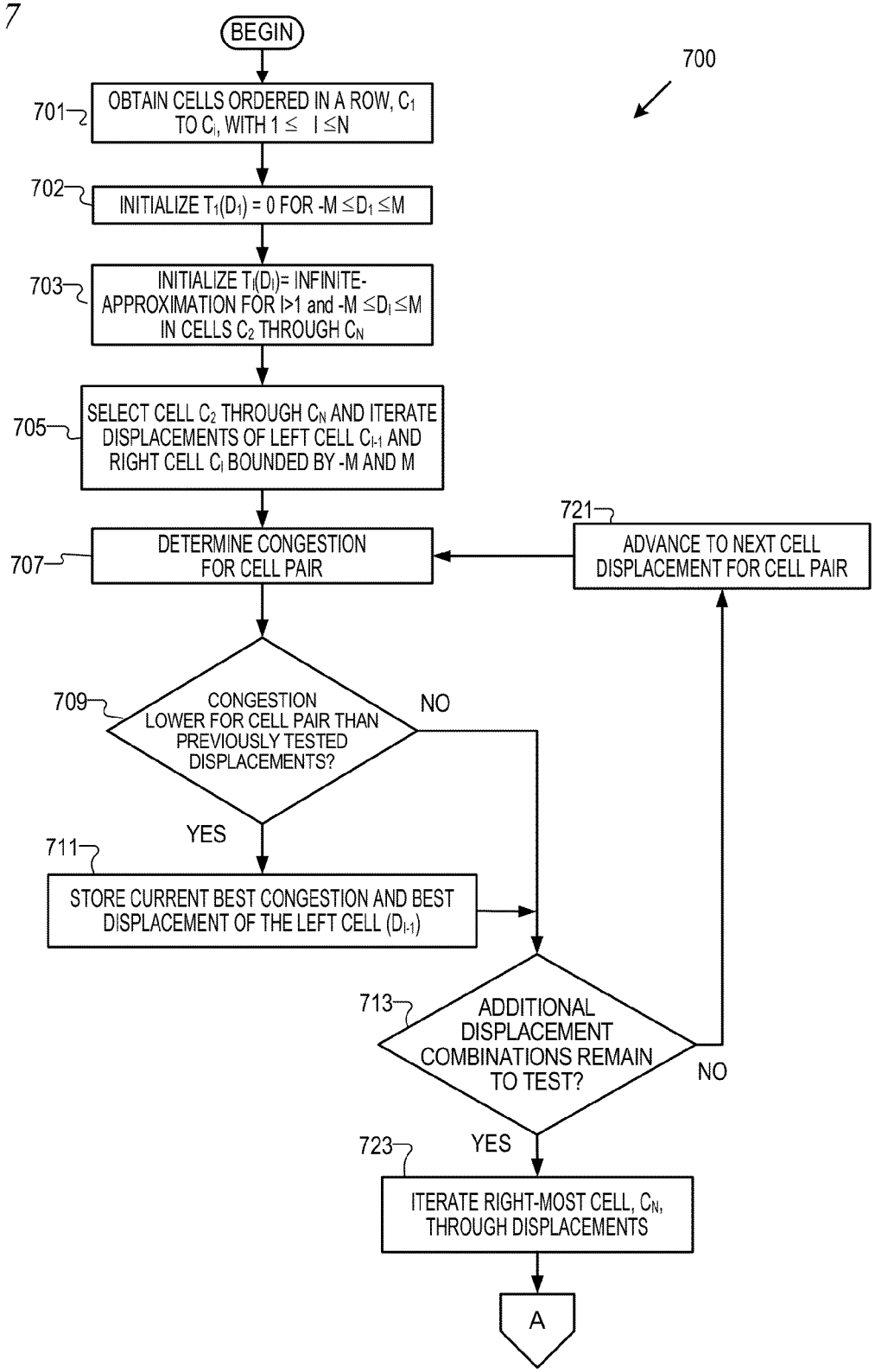
FIG. 7 is a set of steps that an expander may perform to accomplish optimization within a row in accordance with an illustrative embodiment of the invention.
Figure 7:
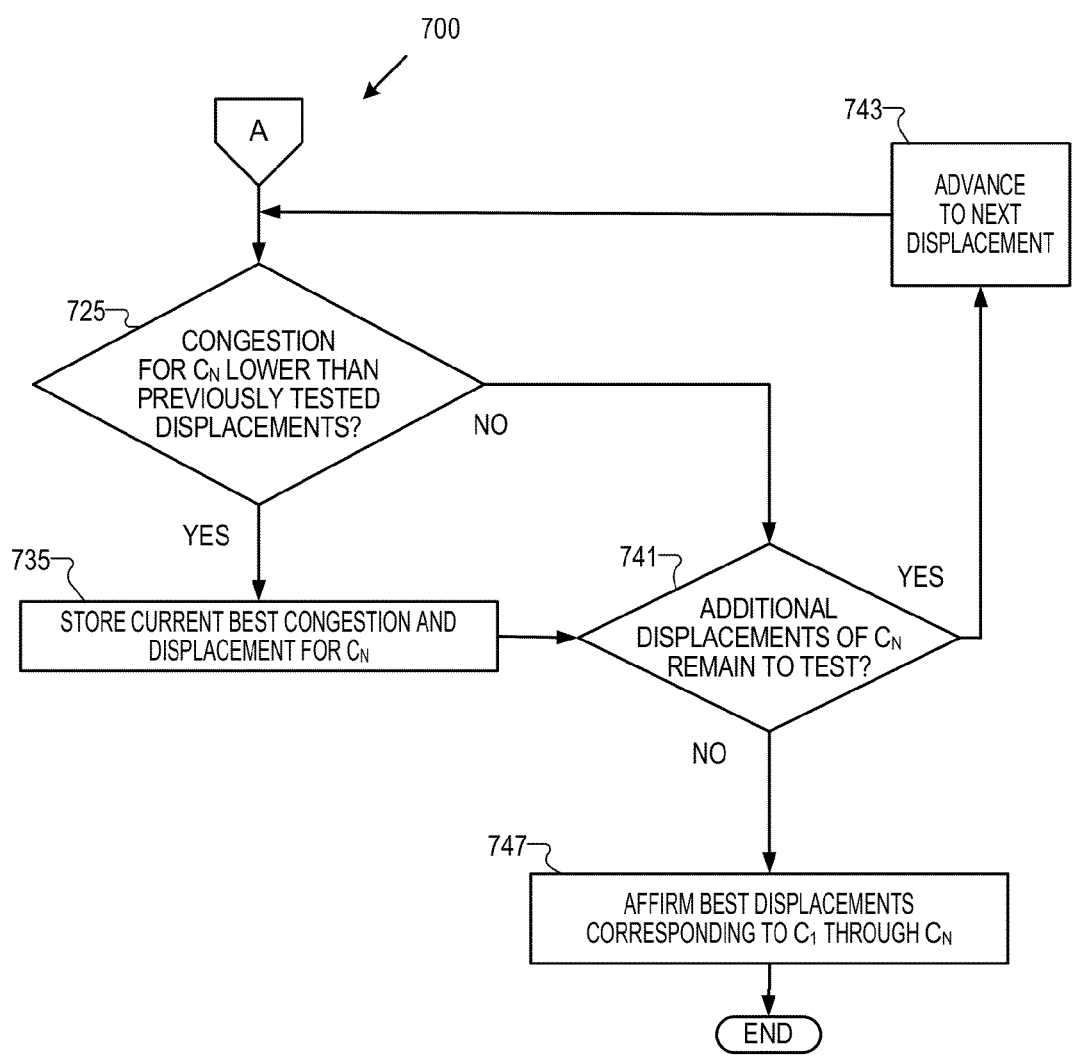

FIG. 7 is a set of steps that an expander may perform to accomplish optimization within a row in accordance with an illustrative embodiment of the invention. Optimization within a row can be performed as a final phase before routing, as depicted at step 309 in FIG. 3. Accordingly, an expander can find new locations for cells within a row that preserve their relative order, while minimizing the maximum cell pair cost, as compared to previous locations for the cells.

A row is a rectangular segment of a semiconductor with a fixed integer number of quantum increments along a direction to which cells may be assigned. The quantum increment is a constant multiplied times the technology width. A slice is a rectangular part of the row that has a quantum increment width. A cell can be assigned to one or more slices, depending on the width of the cell. One of the slices is selected as the cell location. Adjustments to a cell may be made by displacing the cell along a continuum of integer values from the initial cell location. Accordingly, the cell may be evaluated for congestion based on displacement within the row, within a maximum integer displacement, M, from the initial location. A displacement is the integer, between and including $-M$, 0 and M that a cell may be moved from a beginning location in the row. For cells $C_1$ through $C_n$, the corresponding displacements are $d_1$ through $d_n$. A left cell displacement is a displacement assigned or tested for a cell that at a left side of the cell pair. Left corresponds to the cells having a lower index as compared to cells assigned a higher index, such that lower indexed cells are further left in the row compared to higher indexed cells. It is appreciated that the terms 'left' and 'right' are provided merely for convenience. Further, it is appreciated that the terms left and right express the location of the cell or direction of displacement within a frame of reference kept for the row wherein the left side is simply a first extremity of the row and the right side is the second extremity of the row. Accordingly, 'left' merely refers to the typical arrangement of a number line that ascends from left to right. Similarly, the right-most cell is the cell having the highest index, and accordingly is placed to the right of all other cells in the row.

Congestion is a measure of the cell relative to other cells in a row, for a given displacement of the cell from an initial location. Congestion can be based on the detailed routing cost or aggregate detailed routing cost, explained earlier. The formula for congestion may be based on routing cost of a cell, width of the cell, routing cost of a neighbor cell and width of the neighbor cell. A neighbor cell is a cell that is next to a given cell in a row. A cell is next to a given cell if no intervening cell is located between them.

Initially, the expander may obtain n cells ordered in a row, where each cell is denoted by $C_i$, $1 < i \leq n$. (step 701). Next, the expander may initialize congestion of the first or left-most cell, $C_1$, to zero for all cell displacements, $d_1$, $-M \leq d_1 \leq M$. This congestion may be expressed as $t_1(d_1)$ (step 702). Next, the expander may initialize congestion of the remaining cells, $C_2$ through $C_n$, to an infinite-approximation (step 703). A value equivalent to infinity, or infinite-approximation, is any value which may reasonably not be exceeded by any calculation of congestion in the steps of algorithm 700.

Next, the expander may select a left cell corresponding with right cells, $C_2$ through $C_n$, and iterate displacements of left cell and right cell of each cell pair bounded by $-M$ and $M$ (step 705). M is the maximum displacement for a cell. Maximum displacement is the integer largest magnitude that a cell may be moved for purposes of re-evaluating congestion optimization. A maximum displacement may be 10. A cell pair is two cells without an intervening cell located between them. The step of iterating includes initializing loop variables to allow traversing each cell pair.

Next, the expander may determine congestion for the cell pair and allowable displacements for each cell of the cell pair, and for each allowed displacement of each cell in the cell pair (step 707). The operation of step 707 may be according to four substeps, explained below with respect to Equations 5-8.

First, the expander determines the space between the cells in the cell pair i and i+1. Which is the difference between the cell locations, namely $X(C_i+1)$ and $X(C_i)$, and the difference in displacements, namely $d_i+1$ and di, less the width of the left of the two cells, namely, $W(C_i)$.

$$s_i(d_i, d_{i+1}) = X(C_{i+1}) + d_{i+1} - X(C_i) - d_i - W(C_i) \quad \text{Equation (5)}$$

Second, the expander may rely on the space, s, just determined. Accordingly, the expander determines the congestion applying the detailed routing cost or aggregated detailed routing cost, K(C) (Equation 4 above). Further, the expander uses cell widths, and a further factor based on the white-space, S, between the cells, as determined in Equation 5, above:

$$K(C_1, S, C_2) = \left(2^{-\frac{s}{2}}\right) \frac{K(C_1) + K(C_2)}{W(C_1) + W(C_2)} \quad \text{Equation (6)}$$

Third, the expander provides for a possible overlapping of cells using an approximation of infinity, as shown below:

$$K_i(d_i, d_{i+1}) = \begin{cases} K(C_i, s_i(d_i, d_{i+1}), C_{i+1}), & \text{if } s_i(d_i, d_{i+1}) \geq 0 \\ \infty, & \text{if } s_i(d_i, d_{i+1}) < 0 \end{cases} \quad \text{Equation (7)}$$

Fourth, the expander applies an additional cost for the degree to which the cell to the right is displaced, for example, setting beta to 0.01, or other constant selected by a designer:

$$F_i(d_i, d_{i+1}) = K_i(d_i, d_{i+1}) + \beta \cdot (d_{i+1}^2) \quad \text{Equation (8)}$$

Next, the expander may determine whether congestion is lower for the cell pair than previously tested displacements for the cell pair (step 709). The congestion on a cell pair basis may rely on a cost function.

Further, the congestion on a cell pair basis, given displacements for $C_i$ and $C_{i-1}$, namely, $d_i$ and $d_{i-1}$ can be given as, y, below:

$$y = \max(t_{i-1}(d_{i-1}), F_{i-1}(d_{i-1}, d_i)) \quad \text{Equation (9)}$$

where $t_i(d_i)$ denotes the cost of the best placement solution for $C_i, \ldots, C_i$ for each possible $d_i$ value.

A positive result may be followed by the expander storing the current best congestion, y, and best displacement of the left cell, $d_{i-1}$ (step 711). A best displacement of a left cell is a displacement determined to be better, using the congestion measurements for detailed routing, for a given cell, as compared to other displacements for the cell, according to the displacement limitations, row limitations, and other limitations explained above. In other words, the best displacement of the left cell corresponds to the lowest congestion among cell displacements tested for the left cell. Accordingly, the lowest congestion up to the current cell may be assigned the value, y, as described above. Such a lowest congestion measurement corresponds to the best displacement of the current cell, among those displacements tested. Equation 9 can be iterative applied to find the best cost for all combinations of displacement between the left cell and the current cell. Step 711 selects the best cell displacements of left cell and the current cell, which corresponds to the lowest congestion tested for the cell so far.

After step 711 or a negative result at step 709, the expander may determine whether additional displacement combinations remain to test (step 713). A negative determination may cause the expander to advance to a next cell displacement for the cell pair (step 721). The process repeats to step 707 to determine congestion for the cell pair.

A positive result to step 713 may cause the expander to iterate over right-most cell displacements (step 723). Next, the expander may determine whether congestion for the right-most cell, $C_n$, is lower than previously tested displacements (step 725). A positive determination may result in the expander storing a current best congestion and displacement for $d_i$, each for $C_n$ (step 735). A negative result to step 725 and the next step after step 735 may cause the expander to determine whether additional displacements of $C_n$ remain to be tested (step 741).

A positive result to step 741 may result in the expander to advance to a next displacement (step 743). Further processing may continue at step 725.

However, a negative result to step 741 can result in the expander affirming best displacements corresponding to cells $C_i$ through $C_{n-1}$ (step 747). Processing may terminate thereafter.

Step 747 may be responsive to best or optimal displacements corresponding to lowest/best congestions stored at steps 711 and 735. Accordingly, the circuit design may be incrementally modified on a row-by-row basis, adjusting the displacements of cells from an original location, if an improvement to congestion can be measured as a result.

Once optimization within a row is complete, it is possible that congestion for a row or tile remains so high that the routing step cannot be completed. In such a case, substitution of one library cell for a second library cell may be performed in such rows or tiles where the second library cell occupies a smaller area. This can be accomplished by sacrificing fan-out of the cell's outputs, with attendant risks to the logic of the modified design. As such, the second library cell may be equivalent in its logic as compared to the first library cell, but may be more limited in the cells that it can drive, as compared to the first library cell. Accordingly, illustrative embodiments of the invention may apply a data processing system to select one or more of the most highly congested tiles or rows, and substitute library cells as described.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories, which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for reworking a plurality of cells initially placed in a circuit design, the method comprising:

a computer ordering the plurality of cells of a circuit design to form an inflation cell set such that each cell of the circuit design is assigned a corresponding weight calculated from an aggregate routing cost of the cell divided by a cell width of the cell, wherein the aggregate routing cost is a weighted combination of at least two of the group consisting of a count of pins in the cell, pin area cost, and a cost based on a sum for all cells of the plurality of cells of a sum for each cell of each rectangular area that encloses each pair of pins of the cell;

the computer arranging the plurality of cells by each corresponding weight, to form an ordered inflation cell set having a corresponding order;

the computer adding to a subset of cells, each cell of the ordered inflation cell set in the corresponding order, until the cells in the subset of cells, as processed by an operation, exceed a predetermined proportion of an assigned semiconductor area, wherein the operation comprises:

growing a cell to form a growth area summed to an accumulated growth, and comparing the accumulated growth to the predetermined proportion; and, in response to the accumulated growth exceeding the predetermined proportion; the computer legalizing the subset of cells to form overlap-free placement of the cells in the assigned semiconductor area.

* * * * *